(12) United States Patent
Schardt et al.

(10) Patent No.: US 9,904,428 B2
(45) Date of Patent: Feb. 27, 2018

(54) MULTI-LAYER PIEZOELECTRIC POLYMER FILM DEVICES AND METHODS

(71) Applicant: 3M INNOVATIVE PROPERTIES COMPANY, St. Paul, MN (US)

(72) Inventors: Craig R. Schardt, Woodbury, MN (US); Andrew P. Bonifas, Woodbury, MN (US); Derek W. Patzman, St. Paul, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 63 days.

(21) Appl. No.: 15/034,969

(22) PCT Filed: Nov. 18, 2014

(86) PCT No.: PCT/US2014/066055
§ 371 (c)(1),
(2) Date: May 6, 2016

(87) PCT Pub. No.: WO2015/077200
PCT Pub. Date: May 28, 2015

(65) Prior Publication Data
US 2016/0291729 A1    Oct. 6, 2016

Related U.S. Application Data

(60) Provisional application No. 61/907,354, filed on Nov. 21, 2013.

(51) Int. Cl.
*G06F 3/044*   (2006.01)
*H01L 41/22*   (2013.01)
(Continued)

(52) U.S. Cl.
CPC .............. *G06F 3/044* (2013.01); *G06F 3/016* (2013.01); *G06F 3/0414* (2013.01);
(Continued)

(58) Field of Classification Search
None
See application file for complete search history.

(56) References Cited

U.S. PATENT DOCUMENTS 6,297,579 B1   10/2001  Martin et al.
8,884,897 B2   11/2014  Sashida et al.
(Continued)

OTHER PUBLICATIONS

International Search Report for PCT International Application No. PCT/US2014/066055, dated Feb. 26, 2015, 3 pgs.

*Primary Examiner* — Nicholas Lee

(57) ABSTRACT

A touch panel includes a touch sensor having a dielectric core layer disposed between first and second piezoelectric layers. Each piezoelectric layer comprises a poled piezoelectric polymer. The touch sensor further includes at least a first set of individually addressable electrodes disposed over the first piezoelectric layer and at least one second electrode disposed over the second piezoelectric layer. Circuitry is coupled to the first set of electrodes and the second electrode. The circuitry is configured to detect a change in an electrical signal of at least one electrode of the first set of electrodes referenced to the second electrode in response to a touch applied to the touch surface of the touch sensor.

20 Claims, 10 Drawing Sheets

(51) Int. Cl.
*H01L 41/193* (2006.01)
*H01L 41/257* (2013.01)
*G06F 3/041* (2006.01)
*G06F 3/01* (2006.01)
*H01L 41/277* (2013.01)

(52) U.S. Cl.
CPC ............ *H01L 41/193* (2013.01); *H01L 41/22* (2013.01); *H01L 41/257* (2013.01); *H01L 41/277* (2013.01)

(56) References Cited

U.S. PATENT DOCUMENTS

| | | |
|---|---|---|
| 2010/0156845 A1 | 6/2010 | Kim et al. |
| 2011/0141046 A1 | 6/2011 | Sato et al. |
| 2011/0242047 A1 | 10/2011 | Kim et al. |
| 2013/0257744 A1 | 10/2013 | Daghigh et al. |
| 2014/0082490 A1* | 3/2014 | Jung ..................... G06F 3/016 715/702 |

* cited by examiner

MULTI-LAYER PIEZOELECTRIC POLYMER FILM DEVICES AND METHODS

CROSS REFERENCE TO RELATED APPLICATIONS

This application is a national stage filing under 35 U.S.C. 371 of PCT/US2014/066055, filed Nov. 18, 2014, which claims the benefit of U.S. Provisional Application No. 61/907,354, filed Nov. 21, 2013, the disclosures of which are incorporated by reference in their entireties herein.

TECHNICAL FIELD

This disclosure relates generally to piezoelectric films, as well as devices and systems that incorporate such films, and methods pertaining to such films.

BACKGROUND

The piezoelectric effect involves a change in electric field in response to a change in mechanical stress or force. A force applied to a piezoelectric material produces a change in the electric field across the material. Conversely, an electric field applied across a piezoelectric material produces a mechanical deformation of the material.

BRIEF SUMMARY

Embodiments disclosed herein include a touch panel comprising a touch sensor. The touch sensor includes a touch surface, a dielectric core layer. The core layer is disposed between first and second piezoelectric layers, each piezoelectric layer comprising a poled piezoelectric polymer. The touch sensor further includes at least a first set of individually addressable electrodes disposed over the first piezoelectric layer and at least one second electrode disposed over the second piezoelectric layer. Circuitry is coupled to the first set of electrodes and the second electrode. The circuitry is configured to detect a change in an electrical signal of at least one electrode of the first set of electrodes referenced to the second electrode in response to a touch applied to the touch surface.

Some embodiments involve a touch panel that includes a touch sensor. The touch sensor has a touch sensor, a dielectric core layer, and at least one piezoelectric layer comprising a poled piezoelectric polymer disposed over a first surface the dielectric core layer. The touch sensor further includes at least a first set of individually addressable electrodes disposed over the piezoelectric layer and at least one second electrode disposed over a second surface of the core layer. Circuitry is coupled to the first set of electrodes and the second electrode. The circuitry is configured to detect a change in an electrical signal of at least one electrode of the first set of electrodes referenced to the second electrode in response to a touch applied to the touch surface.

Some embodiments involve a method. A touch sensor may be fabricated by coextruding a core layer with at least one piezoelectric polymer layer. The piezoelectric polymer layer is disposed on a first surface of the core layer. The at least one piezoelectric polymer layer is poled by applying an electric field across the at least one piezoelectric polymer layer. A first set of electrodes is formed over the piezoelectric polymer layer and at least one second electrode is formed over a second surface of the core layer. The first set of electrodes and the second set of electrodes are coupled to circuitry configured to detect a change in an electrical signal of at least one electrode of the first set of electrodes referenced to the second electrode in response to a touch applied to the touch sensor.

Some embodiments are directed to a method of implementing a touch sensor. The touch sensor includes a core layer disposed between at the first piezoelectric layer and a second piezoelectric layer. Each piezoelectric layer comprises a poled piezoelectric polymer. At least a first electrode is disposed over the first piezoelectric polymer layer and at least a second electrode is disposed over the second piezoelectric polymer layer. One or both of the first and second electrodes includes an array of individually addressable electrodes. A change in voltage across the sensor responsive to deformation of a first piezoelectric layer of a touch sensor is detected. At least one of touch location and touch force magnitude is determined based on the detected change in voltage.

BRIEF DESCRIPTION OF DRAWINGS

In the figures, like reference numerals designate like elements.

DETAILED DESCRIPTION OF ILLUSTRATIVE EMBODIMENTS

Piezoelectric materials can be used in sensing and energy generating applications. Some embodiments described herein involve touch sensing systems having multilayer touch sensors that incorporate one or more poled piezoelectric polymeric layers. In some implementations, a touch sensor comprises one or more piezoelectric layers which are coextruded with a core layer that provides both mechanical and electrical properties to the sensor. In this configuration, the piezoelectric layers, which are relatively expensive, may be thin compared to the core layer. Decreasing the thickness of the piezoelectric layers reduces the cost of the multilayer device and a core having a low dielectric constant and high resistivity disposed between the relatively thin piezoelectric layers serves to provide a sensor signal of acceptable magnitude. Additionally, the core layer can be configured to enhance stability and handling durability to the touch sensor.

Figure 1:
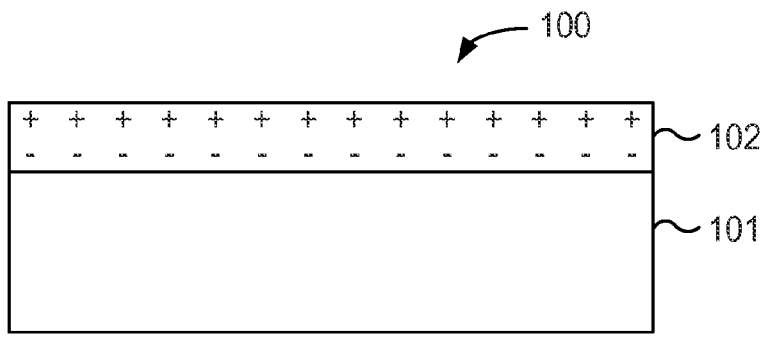
FIG. 1 shows a cross sectional view of a multilayer device that in some implementations may be incorporated into a touch sensor.

FIG. 1 shows a cross sectional view of a multilayer structure 100 that in some implementations may be incorporated into a touch sensor. The structure 100 includes a coextruded core layer 101 and piezoelectric layer 102. The core layer is a non-piezoelectric polymer with the maximum magnitude piezoelectric strain coefficient in all orientations $|d\_3x|<2$ pC/N (where x=1, 2, 3). The piezoelectric layer 102 exhibits piezoelectric properties after it has been stretched and electrically poled to align the dipoles within the material. Alignment of the dipoles can be accomplished by heating the material and applying an electric field to the material while it is heated. Quenching the material after the heating and application of the electric field freezes the dipoles in alignment. Subsequent application of stress and/or deformation of the material creates a voltage across the material as the dipoles realign. Application of a voltage across the material causes the dipoles to realign which in turn causes deformation of the material.

The thickness of the multilayer structure 100 can be about 0.02 mm to 0.2 mm with the thickness of the piezoelectric layer being less than about 10 μm, less than about 7 μm, or less than about 5 μm, less than about 3 μm, less than about 2 μm, less than about 1 μm. In some embodiments the thickness of the piezoelectric layer is in a range of about 1 μm to about 5 μm.

The core layer 101 is non-piezoelectric polymer having maximum magnitude piezoelectric strain coefficient in all orientations $|d\_3x|<2$ pC/N (where x=1, 2, 3). The core layer may comprise a polymer selected to be compatible with the piezoelectric material to facilitate coextrusion and stretching of the multilayer structure. For example, if the piezoelectric material is polyvinylidene fluoride (PVDF), a suitable core layer may comprise poly(methyl) methacrylate (PMMA) or a blend of PMMA and modifiers such as Kraton, a synthetic block copolymer. The core layer may comprise a variety of materials including polypropylene (PP), polyvinyl chloride (PVC), polyethylene terephthalate (PET), Polyethylene naphthalate (PEN), or any other suitable material.

It will be understood that the choice of a core polymer is dependent not only on the intended application, but also on the choice made for the piezoelectric polymer, and the processing conditions employed in coextrusion and/or film stretching. Suitable core polymer materials should be optically clear, and include but are not limited to polyethylene naphthalate (PEN) and isomers thereof (such as 2,6-, 1,4-, 1,5-, 2,7-, and 2,3-PEN), polyalkylene terephthalates (such as polyethylene terephthalate, polybutylene terephthalate, and poly-1,4-cyclohexanedimethylene terephthalate), other polyesters, polycarbonates, polyarylates, polyamides (such as nylon 6, nylon 12, nylon 4/6, nylon 6/6, nylon 6/9, nylon 6/10, nylon 6/12, and nylon 6/T), polyimides (including thermoplastic polyimides and polyacrylic imides), polyamide-imides, polyether-amides, polyetherimides, polyaryl ethers (such as polyphenylene ether and the ring-substituted polyphenylene oxides), polyarylether ketones such as polyetheretherketone ("PEEK"), aliphatic polyketones (such as copolymers and terpolymers of ethylene and/or propylene with carbon dioxide), polyphenylene sulfide, polysulfones (including polyethersulfones and polyaryl sulfones), atactic polystyrene, syndiotactic polystyrene ("sPS") and its derivatives (such as syndiotactic poly-alpha-methyl styrene and syndiotactic polydichlorostyrene), blends of any of these polystyrenes (with each other or with other polymers, such as polyphenylene oxides), copolymers of any of these polystyrenes (such as styrene-butadiene copolymers, styrene-acrylonitrile copolymers, and acrylonitrile-butadiene-styrene terpolymers), polyacrylates (such as polymethyl acrylate, polyethyl acrylate, and polybutyl acrylate), polymethacrylates (such as polymethyl methacrylate, polyethyl methacrylate, polypropyl methacrylate, and polyisobutyl methacrylate), cellulose derivatives (such as ethyl cellulose, cellulose acetate, cellulose propionate, cellulose acetate butyrate, and cellulose nitrate), polyalkylene polymers (such as polyethylene, polypropylene, polybutylene, polyisobutylene, and poly(4-methyl)pentene), fluorinated polymers and copolymers (such as polytetrafluoroethylene, polytrifluoroethylene, polyvinyl fluoride, fluorinated ethylene propylene copolymers, perfluoroalkoxy resins, polychlorotrifluoroethylene, polyethylene-co-trifluoroethylene, polyethylene-co-chlorotrifluoroethylene), chlorinated polymers (such as polyvinylidene chloride and polyvinyl chloride), polyacrylonitrile, polyvinylacetate, polyethers (such as polyoxymethylene and polyethylene oxide), ionomeric resins, elastomers (such as polybutadiene, polyisoprene, and neoprene), silicone resins, epoxy resins, and polyurethanes.

Also suitable are copolymers, miscible or immiscible blends of two or more of the above-described polymers or copolymers. Copolymers of the present invention may be, for example, block copolymers, random copolymers, or alternating copolymers.

Suitable comonomers for use in polyesters such as PET, PEN, PBN or the like may be of the diol or dicarboxylic acid or ester type. Dicarboxylic acid comonomers include but are not limited to terephthalic acid, isophthalic acid, phthalic acid, all isomeric naphthalenedicarboxylic acids (2,6-, 1,2-, 1,3-, 1,4-, 1,5-, 1,6-, 1,7-, 1,8-, 2,3-, 2,4-, 2,5-, 2,7-, and 2,8-), bibenzoic acids such as 4,4'-biphenyl dicarboxylic acid and its isomers, trans-4,4'-stilbene dicarboxylic acid and its isomers, 4,4'-diphenyl ether dicarboxylic acid and its isomers, 4,4'-diphenylsulfone dicarboxylic acid and its isomers, 4,4'-benzophenone dicarboxylic acid and its isomers, halogenated aromatic dicarboxylic acids such as 2-chloroterephthalic acid and 2,5-dichloroterephthalic acid, other substituted aromatic dicarboxylic acids such as tertiary butyl isophthalic acid and sodium sulfonated isophthalic acid, cycloalkane dicarboxylic acids such as 1,4-cyclohexanedicarboxylic acid and its isomers and 2,6-decahydronaphthalene dicarboxylic acid and its isomers, bi- or multi-cyclic dicarboxylic acids (such as the various isomeric norbornane and norbornene dicarboxylic acids, adamantane dicarboxylic acids, and bicyclo-octane dicarboxylic acids), alkane dicarboxylic acids (such as sebacic acid, adipic acid, oxalic acid, malonic acid, succinic acid, glutaric acid, azelaic acid, and dodecane dicarboxylic acid), and any of the isomeric dicarboxylic acids of the fused-ring aromatic hydrocarbons (such as indene, anthracene, pheneanthrene, benzonaphthene, fluorene and the like). Alternatively, alkyl esters of these monomers, such as dimethyl terephthalate, may be used.

Suitable diol comonomers include but are not limited to linear or branched alkane diols or glycols (such as ethylene glycol, propanediols such as trimethylene glycol, butanediols such as tetramethylene glycol, pentanediols such as neopentyl glycol, hexanediols, 2,2,4-trimethyl-1,3-pentanediol and higher diols), ether glycols (such as diethylene glycol, triethylene glycol, and polyethylene glycol), chain-ester diols such as 3-hydroxy-2,2-dimethylpropyl-3-hydroxy-2,2-dimethyl propanoate, cycloalkane glycols such as 1,4-cyclohexanedimethanol and its isomers and 1,4-cyclohexanediol and its isomers, bi- or multicyclic diols (such as the various isomeric tricyclodecane dimethanols, norbornane dimethanols, norbornene dimethanols, and bicyclooctane dimethanols), aromatic glycols (such as 1,4-benzenedimethanol and its isomers, 1,4-benzenediol and its isomers, bisphenols such as bisphenol A, 2,2'-dihydroxy biphenyl and its isomers, 4,4'-dihydroxymethyl biphenyl and its isomers, and 1,3-bis(2-hydroxyethoxy)benzene and its isomers), and lower alkyl ethers or diethers of these diols, such as dimethyl or diethyl diols.

Tri- or polyfunctional comonomers, which can serve to impart a branched structure to the polyester molecules, can also be used. They may be of either the carboxylic acid, ester, hydroxy or ether types. Examples include, but are not limited to, trimellitic acid and its esters, trimethylol propane, and pentaerythritol.

Also suitable as comonomers are monomers of mixed functionality, including hydroxycarboxylic acids such as parahydroxybenzoic acid and 6-hydroxy-2-naphthalenecarboxylic acid, and their isomers, and tri- or polyfunctional comonomers of mixed functionality such as 5-hydroxy-isophthalic acid and the like.

The core layer 101 may be substantially optically transparent, flexible, and elastically deformable. For example, in some implementations, the elastic modulus of the core material may be on the order of about 2.5 to 3 GPa, in other embodiments the elastic modulus of the core material may be on the order of 0.5 GPa. Or in a range between about 0.5 GPa and about 3 GPa. In some embodiments, the core layer 101 can be designed to have specified resistivity and/or dielectric constant. For example, the resistivity of the core layer 101 may be greater than about $10^{15}$ Ω-cm or greater than about $10^{17}$ Ω-cm and the dielectric constant of the material can be less than 10, or less than 7, or less than 5, or in a range of about 2 to about 5. The core layer 101 can be relatively thick compared to the piezoelectric layer 102. For example the thickness of the core layer 101 may be more than 2 times, more than 5 times, or even more than 10 times the thickness of the piezoelectric layer 102.

In some implementations, the piezoelectric layer 102 may be disposed directly on the core layer 101. In other implementations, there may be an intervening layer between the core layer 101 and the piezoelectric layer 102. The piezoelectric layer may be or comprise a layer of PVDF, a fluoropolymer, and/or copolymer of vinylidene fluoride and trifluoroethylene (TrFE). The piezoelectric layer is elastically deformable and in some implementations can have an elastic modulus in a range of about 1 to 1.5 GPa and may be substantially optically transparent. As previously mentioned, to exhibit the piezoelectric characteristic, the PVDF of other layer, is stretched to at least 4 times its original length (uniaxial stretching) or to at least 2 times its original length and width (biaxial stretching), and electrically poled. Stretching uniaxially by 5 times or more, or biaxially by 3 times or more can provide better properties. After the stretching, the piezoelectric layer may have crystallinity in a range of 40% to 60%, for example.

The piezoelectric film may be poled simultaneously while being stretched or may be poled after the stretching. Poling PVDF can involve holding the film at a temperature of 80 to 120° C. with exposure to an electric field of about 50 to 500 MV/m. The poling process may take 30 minutes to several hours which includes time for cooling. Alternatively, PVDF can be poled at room temperature using higher electrical fields, e.g., 100 to 800 MV/m. There are a number of methods that can be used to achieve the poling. The poled piezoelectric polymer has a piezoelectric voltage constant ($d_{33}$) of at least about 5 pC/N.

The poled and stretched piezoelectric layer may have a resistivity greater than about $10^{14}$ Ω-cm, for example, and a dielectric constant greater than that of the core, e.g., about 8 to 14. The relatively lower dielectric constant of the core material when compared to that of the piezoelectric layer may allow for higher electric field concentration in the piezoelectric layers of the multilayer structure when compared with a layer of similar thickness comprising the piezoelectric material without the core. The multilayer structure may additionally or alternatively have reduced leakage current due to the resistivity of the core, (on the order of $10^{17}$ Ω-cm) which can be higher than the resistivity of the piezoelectric layer. The multilayer structure may also exhibit higher electrical breakdown strength than a similar thickness comprising the piezoelectric material without the core.

The core may also have a higher elastic modulus than the piezoelectric layer. For example, the core layer may have an elastic modulus higher, e.g., two or three times higher, than that of the piezoelectric layer. For example, when PMMA and PVDF are used for the core and piezoelectric layers, respectively, the core layer has an elastic modulus of about 3 GPa and the piezoelectric layer has an elastic modulus about 1 to 1.5 GPa.

Stretching causes alignment of the crystals within the PVDF layer. This leads to anisotropy in materials properties such as the thermal expansion, and piezoelectric coefficients. For example, in a uniaxially stretched film, the piezoelectric coefficients might be $d_{31}$~20 pC/N, $d_{32}$~2 pC/N, and $d_{33}$~-30 pC/N. For these values, the directions are defined as is the convention with axis 1 being the direction in which the film is stretched, axis 2 being the orthogonal direction to axis 1 in the plan of the film and axis 3 being the direction normal to the plane of the film. In the case of biaxially oriented film, d31=d32 (i.e., there is no difference in the plane of the film). The orientation of the crystals can be observed via techniques such as X-ray diffraction.

Figure 2:
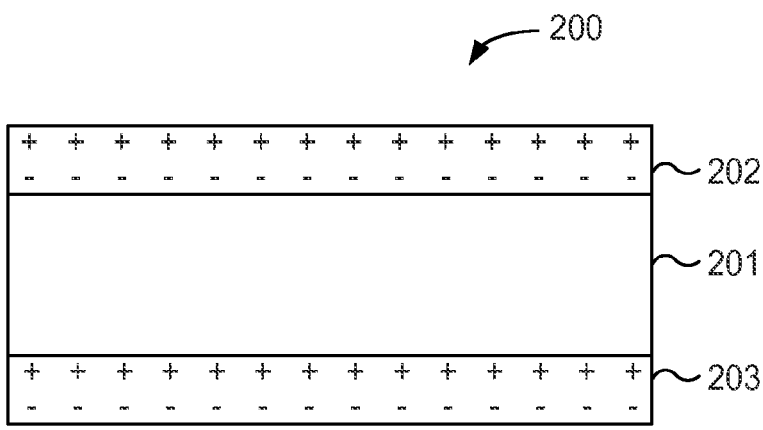
FIG. 2 shows a cross sectional view of another multilayer structure that includes a core layer disposed between first and second piezoelectric layers.

FIG. 2 shows a cross sectional view of another multilayer structure 200 that includes a core layer 201 disposed between first and second piezoelectric layers 202, 203. The core and piezoelectric layers may be coextruded and have similar electrical, optical, and mechanical properties as described in connection with FIG. 1. The core layer is a non-piezoelectric polymer with a maximum magnitude piezoelectric strain coefficient in all orientations |d_3x|<2 pC/N (where x=1, 2, 3). The overall thickness of the multilayer structure 200 may be about 0.025 mm to 0.15 mm. In some embodiments, the core layer has a thickness at least about ⅙ the combined thickness of the core layer, the first piezoelectric layer 202 and the second piezoelectric layer 203. In some embodiments, the core layer has a thickness less than about ⅔ the combined thickness of the core layer, the first piezoelectric layer and the second piezoelectric layer. Each of the first and second piezoelectric layers may have a thickness less than about 10 µm, less than about 7 µm, or even less than about 5 µm, for example.

Figure 3:
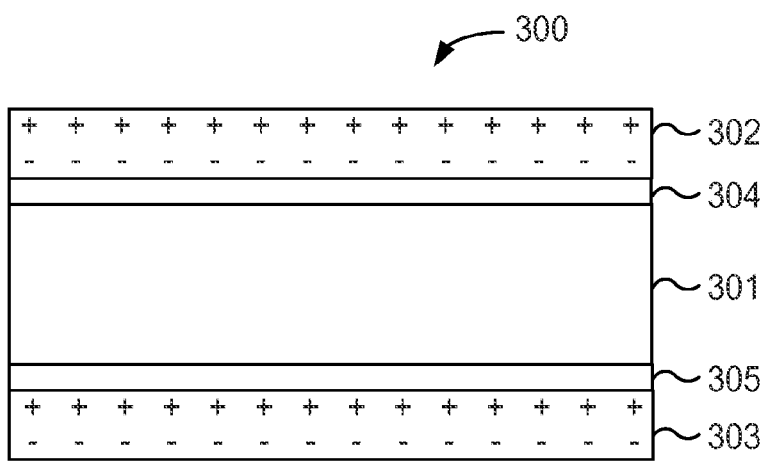
FIG. 3 depicts a multilayer structure that includes one or more tie layers.

As shown in the cross section of FIG. 3, in some embodiments, a multilayer structure 300 may be coextruded including one or more tie layers 304, 305 disposed between at least one of the piezoelectric layers 302, 303 and the core layer 301. A tie layer between core layer 301 and one or both of the piezoelectric layers 302, 303 can allow use of a wider range of polymers for the core layer 301. For example, a thin layer of PMMA could be used as a tie layer to increase the layer adhesion with a PP, PVC, PET, or PEN core layer.

Figure 4:
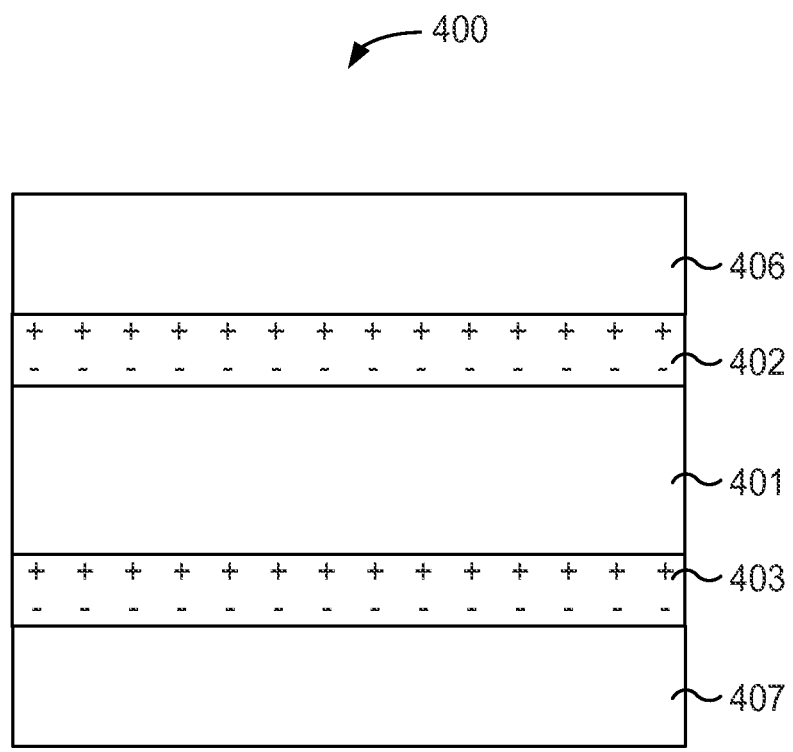
FIG. 4 shows a multilayer structure may be coextruded to include a core layer sandwiched between first and second piezoelectric layers and skin layers disposed on the first and second piezoelectric layers.

As shown in the cross section of FIG. 4, in some embodiments, the multilayer structure 400 may be coextruded to include a core layer 401 sandwiched between first and second piezoelectric layers 402, 403. As shown in FIG. 4, skin layers 406, 407 can be disposed on the first and second piezoelectric layers 402, 403. The skin layers 406, 407 may be easily strippable, allowing them to be removed before further processing of the core 401 and piezoelectric layers 402, 403. For example, the skin layers 406, 407 may be removed after stretching the multilayer structure 400. The skin layers 406, 407 may enhance the stretchability of the multilayer structure 400 and may also make it easier to handle. The skin layers 406, 407, can serve as temporary protective layers for the piezoelectric layers 402, 403, reducing damage to these layers during processing. For example, skins made from PET will adhere well enough to piezoelectric layers of PVDF to allow for stretching and handling of the multilayer structure, but the PET skin layers can still be removed relatively easily for direct access to the PVDF layers, e.g., for fabrication of electrodes on the PVDF layers.

The multilayer structures 100, 200, 300, 400 illustrated in FIGS. 1 through 4 are useful for touch sensing. Touch sensing involves determining information about a touch made to a touch surface, where the information may include detecting touch down, touch lift off, touch locations of one or multiple temporally overlapping touches, touch forces of one or multiple temporally overlapping touches, and/or other touch information. The time duration of the touches may range from a relatively short tap at a single location, to longer touches and/or touches that are tracked as the touches move across the touch surface.

When a touch is applied to the piezoelectric layer, dipoles in the piezoelectric layer are mechanically realigned, producing a transient voltage across the layer. The voltage signal can be detected using electrodes disposed on either side of the piezoelectric layer and analyzed to acquire touch information. The resolution of the touch location information is related to the distribution of individually addressable electrodes disposed across at least one side of a piezoelectric layer.

Figure 5:
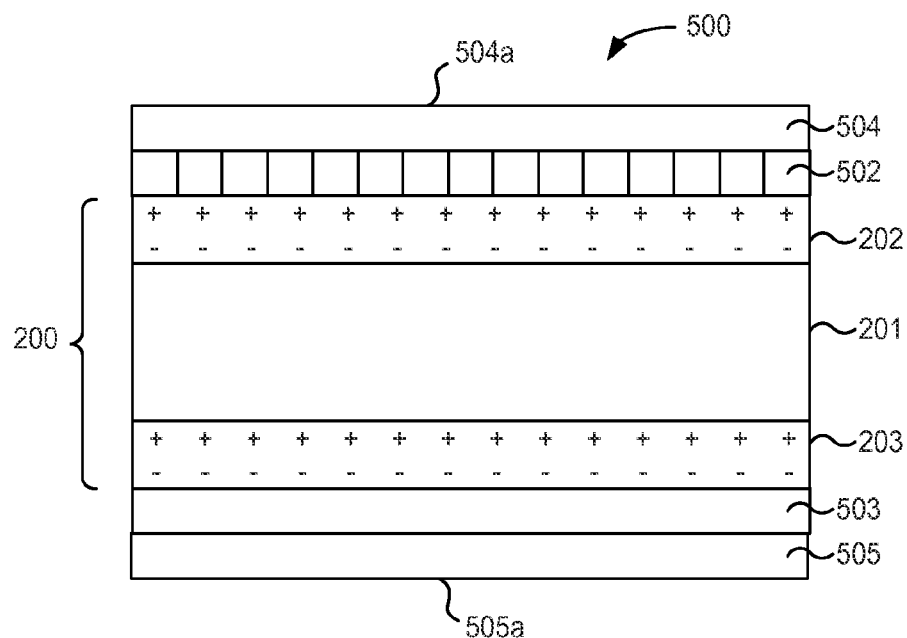
FIG. 5 is a cross sectional view of touch sensor that may incorporate the multilayer structure shown in FIGS. 1, 2, and/or 3.
Figure 6:
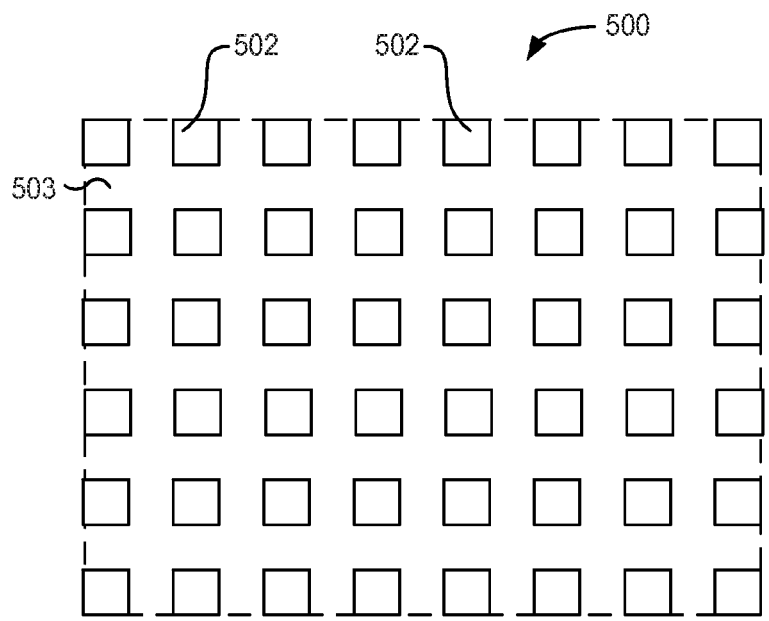
FIG. 6 is a top view of touch sensor that may incorporate the multilayer structure shown in FIGS. 1, 2, and/or 3.

FIG. 5 is a cross sectional view and FIG. 6 is a top view of touch sensor 500 that incorporates the multilayer structure 200 shown in FIG. 2, but which could alternatively incorporate the multilayer structures 100, 300 shown in FIGS. 1 and 3. The multilayer structure 200 includes a core layer 201 disposed between first and second piezoelectric layers 202, 203. Electrodes 502, 503 are disposed on either side of the multilayer structure 200. The electrodes can be deposited directly onto the piezoelectric layers. The electrodes may be transparent. Examples of transparent electrodes include indium tin oxide (ITO) and antimony doped tin oxide (ATO), silver nano-wires, and micro-wire meshes. The electrodes may be unpatterned, e.g., continuous, or patterned on one or both sides of the piezoelectric films.

In the illustrated touch sensor 500 shown in FIGS. 5 and 6, a patterned layer of a conductive material is formed on or over the first piezoelectric layer 202. The patterned layer provides a first set of individually addressable electrodes 502 that are electrically coupled to the first piezoelectric layer 202. An unpatterned layer of conductive material is formed on or over the second piezoelectric layer 203. The unpatterned layer provides a second electrode 503 that is electrically coupled to the second piezoelectric layer 203. Protective layers 504, 505 cover and protect the electrodes 502, 503. The surface 504a, 505a of either or both protective layers 504, 505 may form a touch surface of the touch sensor 500. One or both layers 504, 505 may be elastically deformable, allowing deformation of the piezoelectric layers 202, 203 in response to the touch. In some embodiments, the first protective layer 504 is elastically deformable, surface 504a forms the touch surface, and the second protective layer 505 is rigid.

Figure 7:
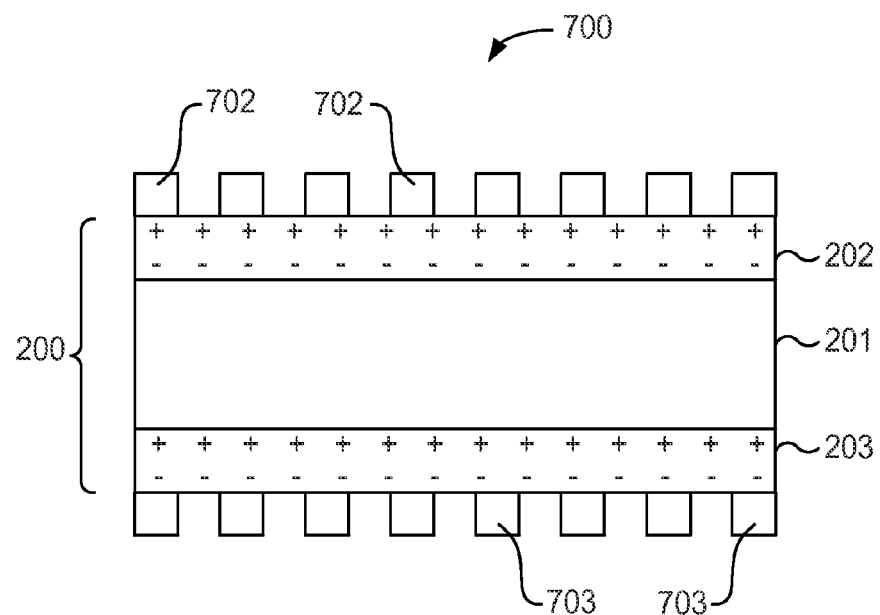
FIG. 7 is a cross sectional view of a touch sensor that includes a patterned conductive layer disposed on or over both piezoelectric layers of a multilayer structure.

FIG. 7 is a cross sectional view of a touch sensor 700 that includes a patterned conductive layer disposed on or over both piezoelectric layers 202, 203 of the multilayer structure 200. The patterned conductive layers provide a first set of individually addressable electrodes 702 disposed on or over the first piezoelectric layer 202 and a second set of individually addressable electrodes 703 disposed over the second piezoelectric layer 203. The protective layers previously described in connection with FIGS. 5 and 6 are not shown in FIG. 7.

Figure 8:
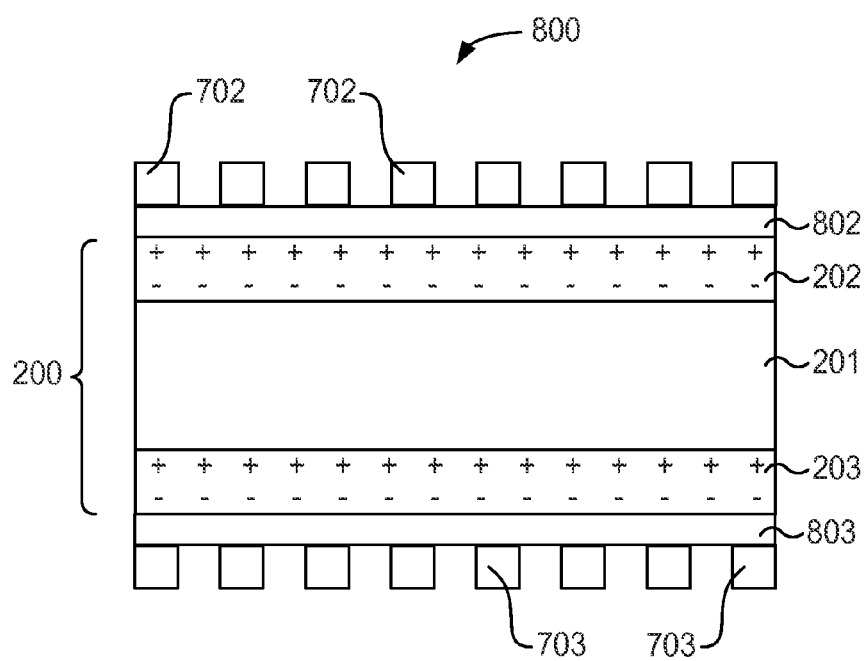
FIG. 8 is a cross sectional view illustrating a touch sensor includes a first adhesion layer disposed between the first set of electrodes and the first piezoelectric layer and a second adhesion layer disposed between the second set of electrodes and the second piezoelectric layer.

FIG. 8 is a cross sectional view illustrating a touch sensor 800 that is similar in some respects to the touch sensor 700 depicted in FIG. 7. Touch sensor 800 additionally includes a first adhesion layer 802 disposed between the first set of electrodes 702 and the first piezoelectric layer 202 and a second adhesion layer 803 disposed between the second set of electrodes 703 and the second piezoelectric layer 203. The adhesion layers 802, 803 may be thin layers that are coextruded on the outer surfaces of the piezoelectric layers 202, 203. The adhesion layers 802, 803 enhance the bond between the electrodes 702, 703 and the piezoelectric layers 202, 203. For example, a thin layer of PET could be used as an adhesion layer since many conductors are formulated to adhere to PET. The adhesion layers may be used in addition to tie layers (not shown) between the piezoelectric layers 202, 203 and the adhesion layers 802, 803 to enhance the bond strength between these layers. In some embodiments the tie layers are PMMA. Alternatively, or in addition to the adhesion layers, the film surface may be treated chemically or via plasma, for example, to enhance the bond between the electrodes and the piezoelectric layers.

Figure 9:
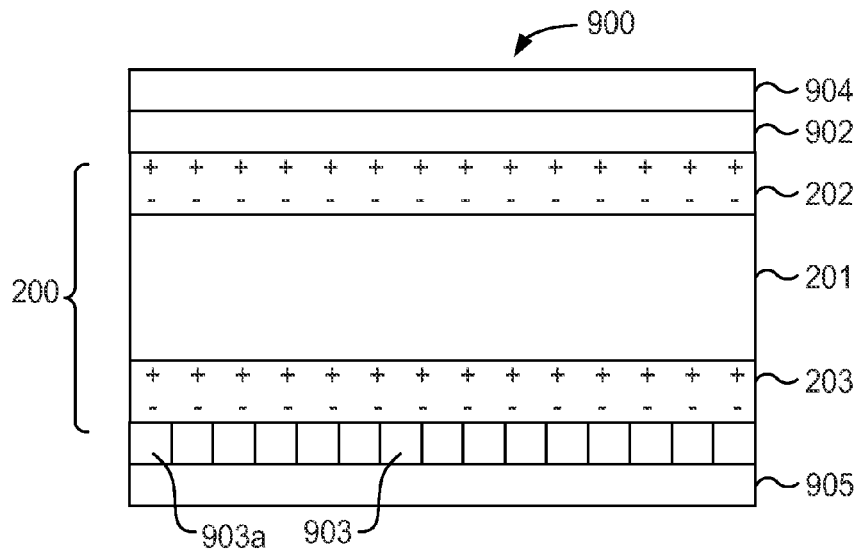
FIGS. 9 and 10 are a cross sectional and top views, respectively, of a touch sensor having a row and column electrode configuration.
Figure 10:
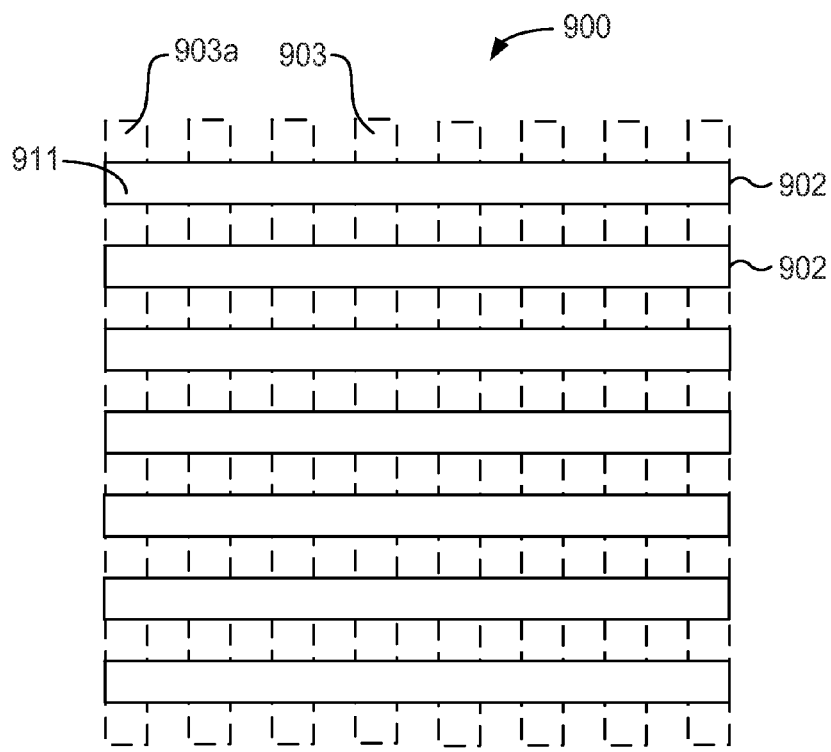

FIG. 9 is a cross sectional view and FIG. 10 is a top view of a touch sensor 900 having a row and column electrode configuration. In this configuration, a first set of electrodes 902 are patterned as row electrodes disposed on or over the first piezoelectric layer 202 of multilayer structure 200. A second set of electrodes 903 are patterned as column electrodes disposed on or over the second piezoelectric layer 203 of multilayer structure 200. In this configuration, the row electrodes 902 can serve as sense electrodes and the column electrodes can serve as select electrodes 903, although the opposite configuration is also possible, wherein the row electrodes serve as select electrodes and the column electrodes serve as sense electrodes. FIG. 9 depicts first and second protective layers 904, 905 covering the electrodes 902, 903.

For example, when select electrode 903a is selected, such as by electrically connecting the select electrode 903a to the sensing circuitry, sensing the electrical signal present at each row sense electrode 902 provides an indication of the deformation state of the piezoelectric layers 202, 203 at the location of each node 911 between the select electrode 903a and the sense electrodes 902. The select electrodes 903 are scanned, e.g., each select electrode is sequentially connected to the sense circuitry, and the voltages at the sense electrodes 902 is recorded to determine the deformation state at each node 911 across the touch surface. A voltage change at any of the nodes indicates a touch at the node location. In addition, the amount or degree of deformation can be used to determine the force of the touch on the touch surface.

Figure 11:
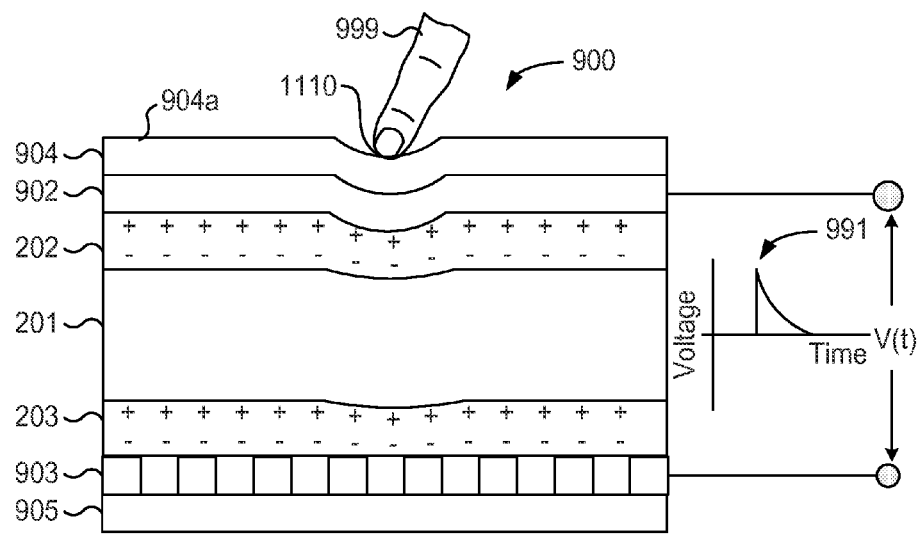
FIGS. 11 and 12 are cross sectional diagrams of a touch sensor during touch down and touch lift off events, respectively.
Figure 12:
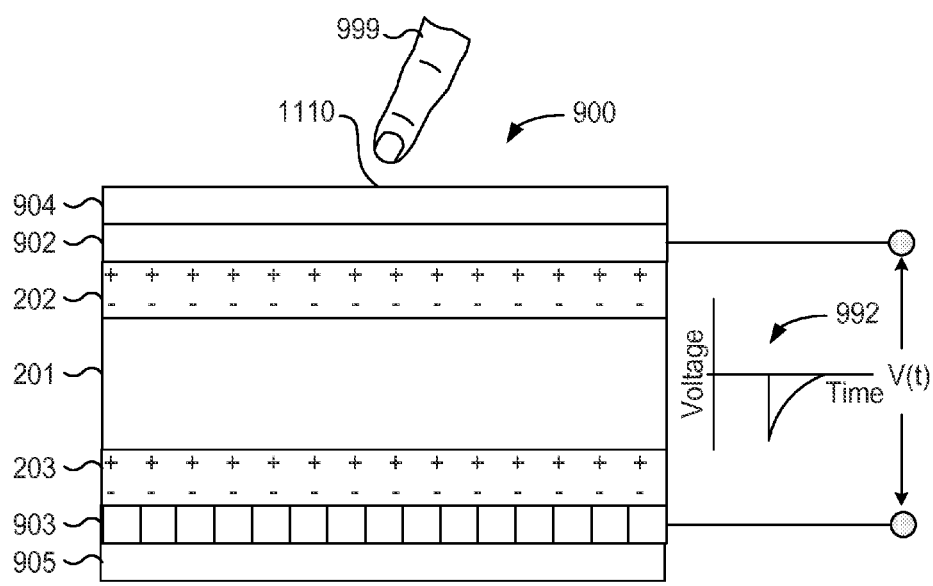

FIGS. 11 and 12 are cross sectional diagrams of the touch sensor 900 during touch down and touch lift off events, respectively. FIGS. 11 and 12 also show idealized versions of the signal output, V(t), of the touch sensor 900 during the touch down and touch lift off events.

A touch applied to the touch surface by a touch implement, such as a finger 999, causes a localized deformation of the touch surface 904a at the touch location 1110, which in turn causes a localized deformation of one or both of the piezoelectric layers 202, 203. The localized deformation of the piezoelectric layers produces a transient voltage signal 991 caused by movement of the dipoles in one or both of the piezoelectric layers 202, 203 during the deformation caused by the touch implement 999. The transient voltage signal 991 corresponding to a touch down event is detectable across the electrodes 902, 903 that are in the vicinity of the touch location 1110.

Touch lift off occurs when the touch implement 999 is removed from the touch surface as illustrated in FIG. 12. When the touch is removed, the touch surface elastically returns to its previous position. When the deformation is removed, realignment of the dipoles in one or both of the piezoelectric layers produces a transient voltage signal 992 in the vicinity of the location 1110 of the previous touch. The transient voltage signal 992 corresponding to a touch lift off event is detectable between the electrodes 902, 903 that are in the vicinity of the touch location 1110.

Figure 13:
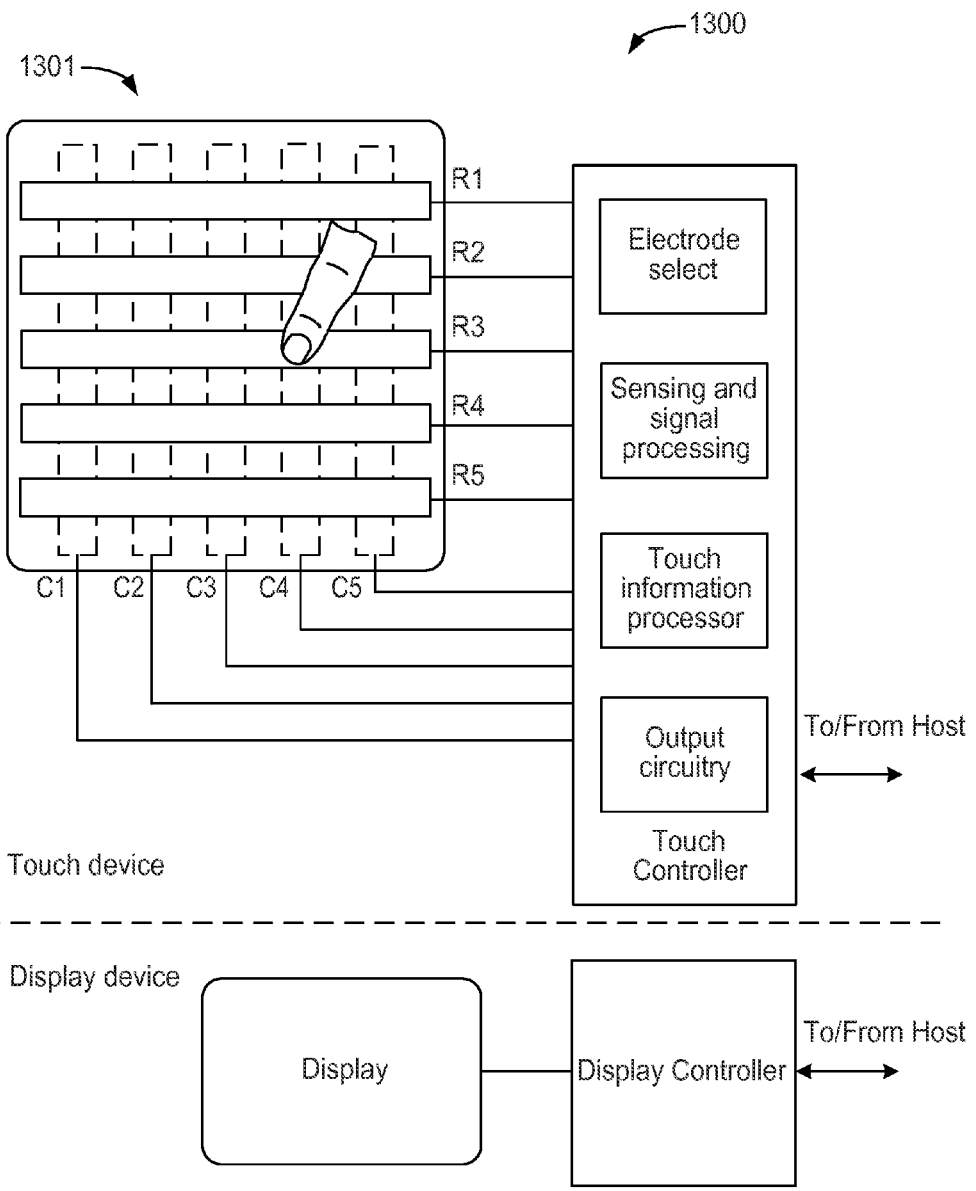
FIG. 13 shows a touch display system that includes circuitry for touch sensing, touch signal processing, and displaying information.

FIG. 13 shows a touch display system 1300 that includes circuitry for touch sensing, touch signal processing, and displaying information. A touch device includes a touch sensor 1301 and touch controller configured for touch sensing and touch signal processing. A display device includes a display and a display controller. The touch and display controllers may be coupled to a host computer. If the layers of the touch sensor 1301 are substantially optically transparent, the display may be arranged so that it is viewable through the touch sensor 1301. FIG. 13 depicts a touch sensor having row R1-R5 and column C1-C2 electrodes electrically coupled to touch controller circuitry. The touch controller includes electrode select circuitry, such as multiplexers, configured to scan through the select electrodes while sensing touch input signals from the sense electrodes using sensing circuitry. The sensing circuitry may include various signal processing components, such as filters, e.g., notch, bandpass, low and/or high pass filters, amplifiers, threshold detectors, analog-to-digital converters, and/or other signal processing components. The processed touch input signals are optionally analyzed by a touch information processor present in the touch controller. The touch information processor is configured to determine touch information based on the processed touch input signal. In some embodiments the processed touch input signals may be transferred to a host computer and the host computer determines the touch information.

Figure 14:
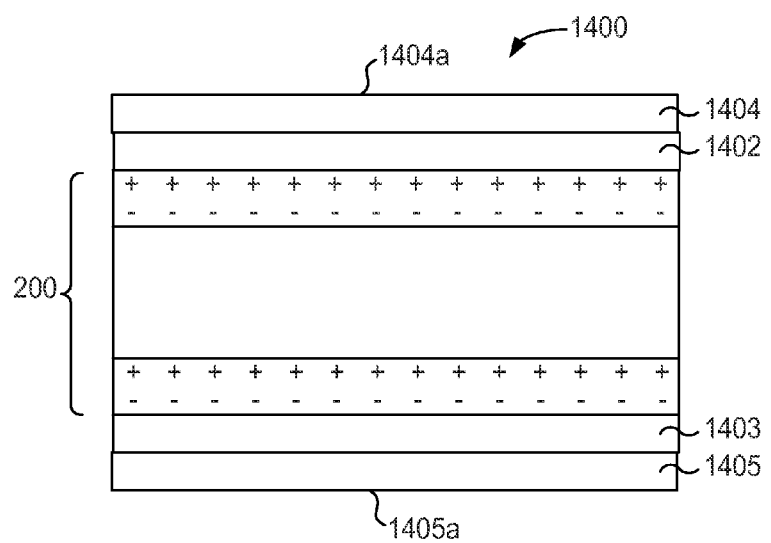
FIG. 14 shows a device comprising multilayer structure disposed between unpatterned electrode layers.
Figure 15:
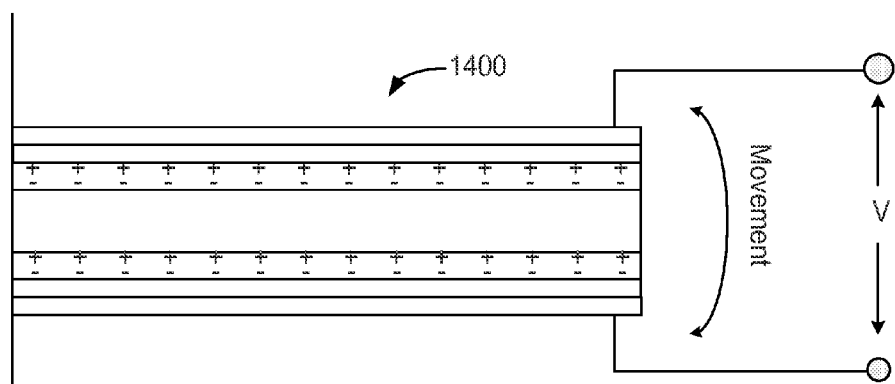
FIG. 15 shows a multilayer structure used in an energy harvesting device.

As previously discussed, the multilayer structures depicted herein can be used to form touch sensors that can be used to determine touch information including touch location and touch force. While useful for touch sensing, the multilayer structures described and depicted herein may be implemented in a number of applications, including energy harvesting (harvesting the energy created by motion of the multilayer structure) and large area pressure sensing. In both large area pressure sensing and energy harvesting, multilayer structures similar to those depicted in FIGS. 1 through 8 may be used. In these applications, both of the electrode layers may be unpatterned as shown in FIGS. 14 and 15. FIG. 14 shows a device 1400 comprising multilayer structure 200 disposed between unpatterned electrode layers 1402, 1403. Protective layers 1404, 1405 are arranged on the electrode layers 1402, 1403. For large area pressure sensing applications changes in pressure at the pressure sensing surface, which can be one or both of surfaces 1404a and 1405a causes deformation of the piezoelectric layers within the multilayer structure 200. The deformation is detected as a transient voltage signal between the electrodes 1402, 1403.

For energy harvesting applications, illustrated in FIG. 15, the multilayer structure 1400 can be used to form a piezoelectric cantilever that bends or moves, generating energy. The energy generated by movement of the multilayer structure 1400 can be stored in a capacitor or other energy storage device.

Figure 16:
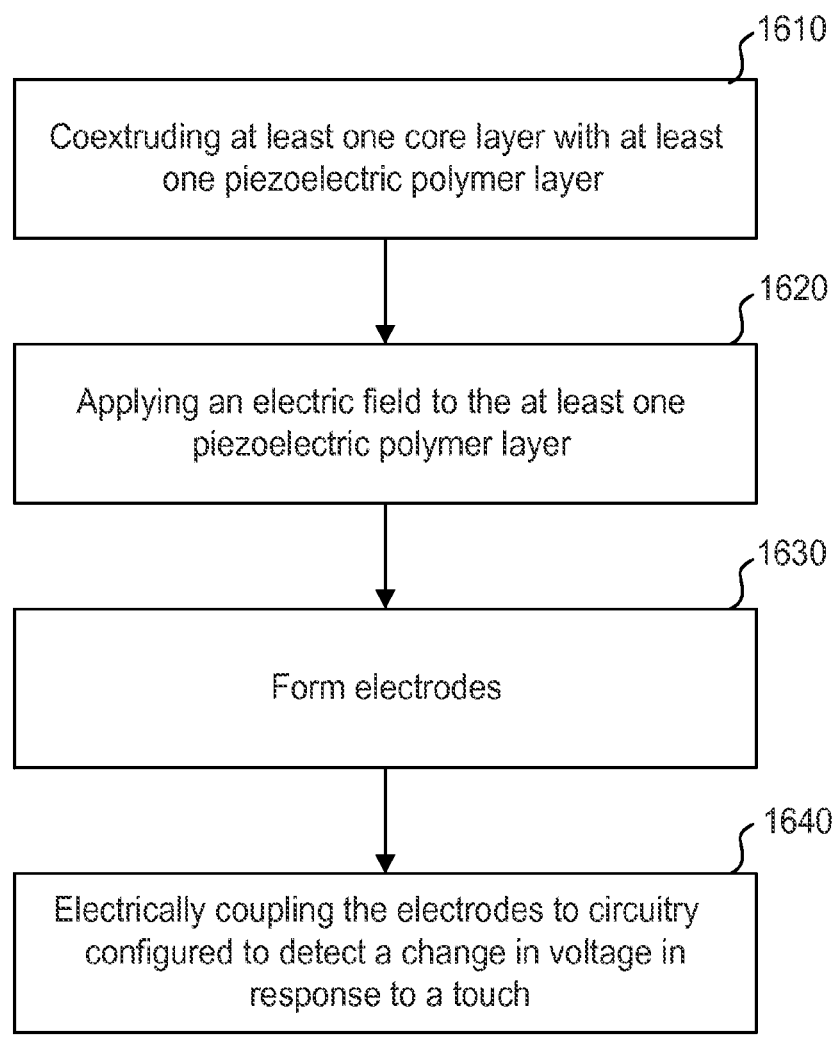
FIG. 16 is a flow diagram illustrating a method of making multilayer structures.

FIG. 16 is a flow diagram illustrating a method of making multilayer structures discussed herein. The method includes coextruding 1610 at least one core layer with at least one piezoelectric polymer layer, forming a coextruded subassembly. The coextruded subassembly is stretched, heated, and an electric field is applied 1620 to the heated subassembly to pole the piezoelectric polymer layer. Electrodes are formed 1630 on either side of the coextruded subassembly. In various applications, the electrodes can optionally be coupled 1640 to circuitry configured to detect touch, pressure, or provide energy storage.

In some configurations, the at least one piezoelectric polymer layer comprises a first piezoelectric polymer layer and a second piezoelectric polymer layer. In this configuration, coextruding the core layer with the at least one piezoelectric polymer layer comprises coextruding the core layer sandwiched between the first piezoelectric polymer layer and the second piezoelectric polymer layer.

The coextruding can include coextruding a strippable layer disposed on the at least one piezoelectric polymer layer. When first and second piezoelectric layers are used, the coextruding can include coextruding a first strippable layer on the first piezoelectric layer and a second strippable layer on the second piezoelectric layer. The strippable layers are stripped from the piezoelectric polymer layer and electrodes are formed on the piezoelectric layers.

In some implementations, coextruding includes coextruding at least one of a first tie layer disposed between the core layer and a first piezoelectric polymer layer and a second tie layer disposed between the core layer and the second piezoelectric polymer layer. Coextruding may additionally or alternatively include one or more of coextruding a first adhesion layer on the first piezoelectric layer and coextruding a second adhesion layer on the second piezoelectric polymer layer.

Figure 17:
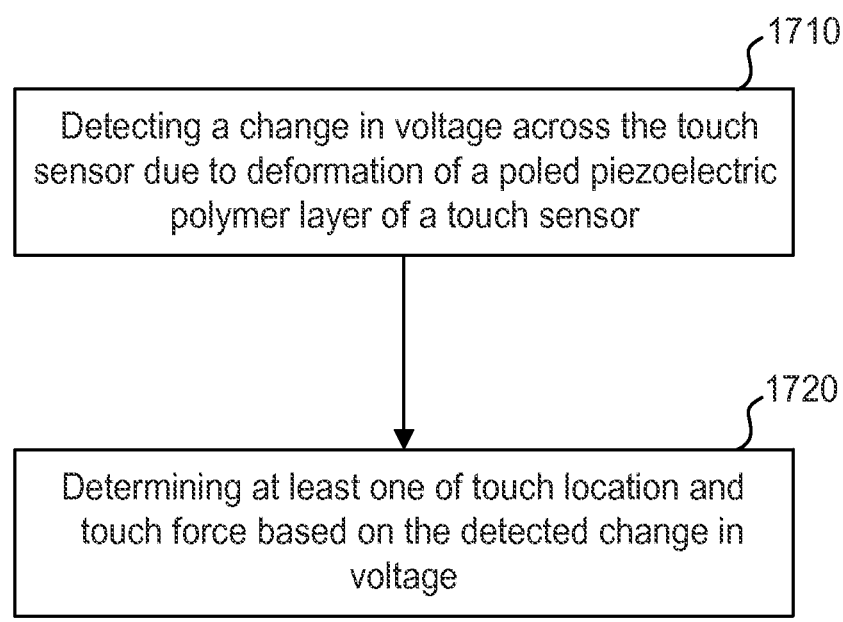
FIG. 17 illustrates a method of using a multilayer structure for touch sensing.

FIG. 17 illustrates a method of using a multilayer structure described herein for touch sensing. The method include detecting 1710 a change in voltage across a electrodes of a touch sensor due to deformation of a poled piezoelectric layer of the touch sensor, the touch sensor including a core layer disposed between a first piezoelectric layer and a second piezoelectric layer, each piezoelectric layer comprising a poled piezoelectric polymer. The electrodes include at least a first electrode disposed over the first piezoelectric layer and at least a second electrode disposed over the second piezoelectric layer. One or both of the first and second electrodes comprise individually addressable electrodes. At least one of a touch location and touch force is determined 1720 based on the detected change in voltage. In some implementations, the at least one first electrode comprises a first set of individually addressable electrodes and the at least one second electrode comprises a second set of individually addressable electrodes. Detecting the change in voltage comprises detecting the change in voltage from an electrode of the first set referenced to an electrode of the second set.

In some implementations, determining the touch location comprises determining locations of multiple touches that may occur simultaneously or substantially simultaneously. The touch locations of a touch that moves across the touch surface can be determined from the changes in voltages.

Touch sensing using a piezoelectric-based sensor can facilitate detection of a gloved touch or a stylus touch, which is not as straightforwardly accomplished using other touch sensing methods such as capacitive sensing. As such, a touch device may be configured incorporate both touch sensing techniques such that piezoelectric touch sensing is combined with capacitive touch sensing to enhance acquisition of touch sensing information. For example, capacitive sensing can be used in certain circumstances, such as for finger touches, and piezoelectric touch sensing can be used in other circumstances, such as for stylus or gloved touches. In some embodiments, piezoelectric sensing can be used to acquire some touch information, e.g., touch down, touch lift off and/or touch force, and capacitive touch sensing can be used to acquire different touch information, such as touch location. In some implementations, the piezoelectric sensing and capacitive sensing may use the same electrodes, with the touch controller circuitry including additional circuitry for driving electrodes for capacitive sensing. The touch controller circuitry may be configured to sequentially apply a drive signal to a first set of the electrodes and to sense the response signal at each electrode of a second set. Both the change in voltage across the touch sensor responsive to the deformation caused by the touch and the response signal indicative of a change in capacitance can be analyzed to provide information about the touch. In some implementations, the analysis may include separating the signal component generated by the piezoelectric layer from the signal component generated by the capacitive sensing. For example, the signal component generated by the piezoelectric layer may be separated from the signal component generated by the capacitive sensing by appropriate filtering and/or other signal processing.

As previously discussed a voltage applied across the multilayer structure including one or more piezoelectric layers can cause movement of the piezoelectric layers caused by alignment of the dipoles with the applied voltage. This phenomenon may be useful to provide haptic feedback to a user. For example, when a touch is detected at a location, a voltage may be applied to the electrodes at the touch location, causing movement of the piezoelectric layer that is discernible by the user.

Embodiments disclosed herein include:

Item 1. A touch panel, comprising:
  a touch sensor, comprising:
    a touch surface;
    a dielectric core layer;
    at least a first piezoelectric layer and a second piezoelectric layer, the dielectric core layer disposed between the first and second piezoelectric layers, each piezoelectric layer comprising a poled piezoelectric polymer;
    at least a first set of individually addressable electrodes disposed over the first piezoelectric layer; and
    at least one second electrode disposed over the second piezoelectric layer; and
  circuitry coupled to the first set of electrodes and the second electrode, the circuitry configured to detect a change in an electrical signal of at least one electrode of the first set of electrodes referenced to the second electrode in response to a touch applied to the touch surface.

Item 2. The touch panel of item 1, wherein the at least one second electrode comprises a second set of individually addressable electrodes and the circuitry is configured to detect a change in one or more electrical signals of one or more electrodes of the first set referenced respectively to one or more electrodes of the second set.

Item 3. The touch panel of any of items 1 through 2, wherein the first poled piezoelectric polymer layer is disposed directly on a first surface of the core layer and the second poled piezoelectric polymer layer is disposed directly on a second surface of the core layer.

Item 4. The touch panel of any of items 1 through 3, wherein the poled piezoelectric polymer comprises polyvinylidene fluoride (PVDF).

Item 5. The touch panel of any of items 1 through 3, wherein the poled piezoelectric polymer comprises a fluoropolymer or a PVDF—trifluoroethylene (TrFE) copolymer.

Item 6. The touch panel of any of items 1 through 5, wherein the poled piezoelectric polymer has a piezoelectric voltage constant ($d_{33}$) of at least about 5 pC/N.

Item 7. The touch panel of any of items 1 through 6, wherein the core layer comprises a polymer.

Item 8. The touch panel of any of items 1 through 6, wherein the core layer comprises poly(methyl methacrylate (PMMA).

Item 9. The touch panel of any of items 1 through 8, wherein the core layer has a dielectric constant of about 2 to about 5.

Item 10. The touch panel of any of items 1 through 9, wherein the core layer has a resistivity of greater than about $10^{15}$ Ω-cm.

Item 11. The touch panel of any of items 1 through 10, wherein the core layer has an elastic modulus in a range of about 0.5 GPa to about 3 GPa.

Item 12. The touch panel of any of items 1 through 11, wherein the core layer has a thickness at least about ⅙ the combined thickness of the core layer, the first piezoelectric layer and the second piezoelectric layer.

Item 13. The touch panel of any of items 1 through 11, wherein the core layer has a thickness less than about ⅔ the combined thickness of the core layer, the first piezoelectric layer and the second piezoelectric layer.

Item 14. The touch panel of any of items 1 through 13, wherein the combined thickness of the core layer, the first piezoelectric layer and the second piezoelectric layer is in a range of about 0.02 to about 0.2 μm.

Item 15. The touch panel of any of items 1 through 14, wherein the each of the first and second poled piezoelectric polymer layers have a thickness of about 1 μm to about 5 μm.

Item 16. The touch panel of items 1 through 15, wherein the core layer, the first and second piezoelectric layers, the first set of electrodes, and the at least one second electrode are substantially optically transparent.

Item 17. The touch panel of any of items 1 through 16, further comprising one or more of:
a first tie layer disposed between the first piezoelectric layer and the core layer; and
a second tie layer disposed between the second piezoelectric layer and the core layer.

Item 18. The touch panel of any of items 1 through 17, further comprising one or more of:
a first adhesion layer disposed between the first set of electrodes and the first piezoelectric layer; and
a second adhesion layer disposed between the at least one second electrodes and the second piezoelectric layer.

Item 19. The touch panel of any of items 1 through 18, further comprising an electronic display wherein the electronic display is viewable through the touch sensor.

Item 20. The touch panel of any of claims 1 through 19, further comprising at least one of:
a first protective layer disposed over the first set of electrodes; and
a second protective layer disposed over the at least one second set of electrodes.

Item 21. A touch panel, comprising:
a touch sensor, comprising:
a touch surface;
a dielectric core layer;
at least one piezoelectric layer comprising a poled piezoelectric polymer disposed over a first surface the dielectric core layer;
at least a first set of individually addressable electrodes disposed over the piezoelectric layer; and
at least one second electrode disposed over a second surface of the core layer; and
circuitry coupled to the first set of electrodes and the second electrode, the circuitry configured to detect a change in an electrical signal of at least one electrode of the first set of electrodes referenced to the second electrode in response to a touch applied to the touch surface.

Item 22. The touch panel of item 21, wherein the piezoelectric layer has a thickness less than about 5 μm.

Item 23. A method, comprising:
fabricating a touch sensor, comprising:
coextruding a core layer with at least one piezoelectric polymer layer, the piezoelectric polymer layer disposed on a first surface of the core layer;
poling the at least one piezoelectric polymer layer by applying an electric field across the at least one piezoelectric polymer layer;
forming a first set of electrodes over the piezoelectric polymer layer;
forming at least one second electrode over a second surface of the core layer; and
coupling the first set of electrodes and the second set of electrodes to circuitry configured to detect a change in an electrical signal of at least one electrode of the first set of electrodes referenced to the second electrode in response to a touch applied to the touch sensor.

Item 24. The method of item 23, wherein:
the at least one piezoelectric polymer layer comprises a first piezoelectric polymer layer and a second piezoelectric polymer layer; and
coextruding the core layer with the at least one piezoelectric polymer layer comprises coextruding the core layer sandwiched between the first piezoelectric polymer layer and the second piezoelectric polymer layer.

Item 25. The method of any of items 23 through 24, wherein:
the coextruding comprises coextruding a strippable layer disposed on the at least one piezoelectric polymer layer;
stripping the strippable layer from the piezoelectric polymer layer; and
fabricating a set of electrodes on the piezoelectric polymer layer.

Item 26. The method of any of items 23 through 25, wherein the coextruding comprises coextruding at least one of:
a first tie layer disposed between the core layer and the first piezoelectric polymer layer; and
a second tie layer disposed between the core layer and the second piezoelectric polymer layer.

Item 27. The method of any of items 23 through 26, wherein coextruding comprises at least one of:
coextruding a first adhesion layer on the first piezoelectric polymer layer before forming the first set of electrodes; and
coextruding a second adhesion layer on the second piezoelectric polymer layer before forming the second set of electrodes.

Item 28. A method comprising:
detecting a change in voltage across the sensor responsive to deformation of a first piezoelectric layer of a touch sensor, the touch sensor comprising:
a core layer disposed between at the first piezoelectric layer and a second piezoelectric layer, each piezoelectric layer comprising a poled piezoelectric polymer;
at least a first electrode disposed over the first piezoelectric polymer layer; and
at least a second electrode disposed over the second piezoelectric polymer layer, one or both of the first and second electrodes comprising an array of individually addressable electrodes;
determining at least one of touch location and touch force magnitude based on the detected change in voltage.

Item 29. The method of item 28, wherein determining the touch location comprises determining locations of multiple touches.

Item 30. The method of any of items 28 through 29, wherein determining the touch location comprises determining touch locations of a moving touch.

Item 31. The method of any of items 28 through 30, wherein:
the at least one first electrode comprises a first set of individually addressable electrodes;
the at least one second electrode comprises a second set of individually addressable electrodes; and
detecting the change in voltage comprises detecting the change in voltage from an electrode of the first set referenced to an electrode of the second set.

Item 32. The method of item 31, wherein the first set of electrodes is capacitively coupled to second set of electrodes at an array of nodes, the method further comprising:
sequentially driving the electrodes of the first set using a drive signal;
sensing a response signal at each electrode of the second set;
detecting a change in the response signal indicative of a change in capacitance at one or more of the nodes in response to a touch near the one or more nodes; and
using both the change in voltage across the touch sensor responsive to the deformation caused by the touch and the response signal indicative of a change in capacitance to provide information about the touch.

Item 33. The method of any of items 28 through 32, further comprising applying a voltage to the first and second electrodes to provide haptic feedback to a user.

Unless otherwise indicated, all numbers expressing quantities, measurement of properties, and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the embodiments are approximations, to the extent any numerical values are set forth in specific examples described herein, they are reported as precisely as reasonably possible. Any numerical value, however, may well contain errors associated with testing or measurement limitations.

Various modifications and alterations of the embodiments disclosed herein will be apparent to those skilled in the art. For example, the reader should assume that features of one disclosed embodiment can also be applied to all other disclosed embodiments unless otherwise indicated.

The invention claimed is:

1. A touch panel, comprising:
    a touch sensor, comprising:
        a touch surface;
        a dielectric core layer;
        at least a first piezoelectric layer and a second piezoelectric layer, the dielectric core layer disposed between the first and second piezoelectric layers, each piezoelectric layer comprising a poled piezoelectric polymer;
        at least a first set of individually addressable electrodes disposed over the first piezoelectric layer; and
        at least one second electrode disposed over the second piezoelectric layer; and
    circuitry coupled to the first set of electrodes and the second electrode, the circuitry configured to detect a change in an electrical signal of at least one electrode of the first set of electrodes referenced to the second electrode in response to a touch applied to the touch surface.

2. The touch panel of claim 1, wherein the at least one second electrode comprises a second set of individually addressable electrodes and the circuitry is configured to detect a change in one or more electrical signals of one or more electrodes of the first set referenced respectively to one or more electrodes of the second set.

3. The touch panel of claim 1, wherein the first poled piezoelectric polymer layer is disposed directly on a first surface of the core layer and the second poled piezoelectric polymer layer is disposed directly on a second surface of the core layer.

4. The touch panel of any of claim 1, wherein the poled piezoelectric polymer comprises polyvinylidene fluoride (PVDF).

5. The touch panel of any of claim 1, wherein the poled piezoelectric polymer comprises a fluoropolymer or a PVDF—trifluoroethylene (TrFE) copolymer.

6. The touch panel of claim 1, wherein the poled piezoelectric polymer has a piezoelectric voltage constant ($d_{33}$) of at least about 5 pC/N.

7. The touch panel of claim 1, wherein the core layer comprises a polymer.

8. The touch panel of claim 1, wherein the core layer comprises poly(methyl methacrylate (PMMA).

9. The touch panel of claim 1, wherein the core layer has a dielectric constant of about 2 to about 5.

10. The touch panel of claim 1, wherein the core layer has a resistivity of greater than about $10^{15}$ Ω-cm.

11. The touch panel of claim 1, wherein the core layer has an elastic modulus in a range of about 0.5 GPa to about 3 GPa.

12. The touch panel of claim 1, wherein the core layer has a thickness at least about ⅙ the combined thickness of the core layer, the first piezoelectric layer and the second piezoelectric layer.

13. The touch panel of claim 1, wherein the core layer has a thickness less than about ⅔ the combined thickness of the core layer, the first piezoelectric layer and the second piezoelectric layer.

14. The touch panel of claim 1, wherein a combined thickness of the core layer, the first piezoelectric layer and the second piezoelectric layer is in a range of about 0.02 to about 0.2 μm.

15. The touch panel of claim 1, wherein the each of the first and second poled piezoelectric polymer layers have a thickness of about 1 μm to about 5 μm.

16. The touch panel of claim 1, wherein the core layer, the first and second piezoelectric layers, the first set of electrodes, and the at least one second electrode are substantially optically transparent.

17. The touch panel of claim 1, further comprising one or more of:
    a first tie layer disposed between the first piezoelectric layer and the core layer; and
    a second tie layer disposed between the second piezoelectric layer and the core layer.

18. The touch panel of claim 1, further comprising one or more of:
    a first adhesion layer disposed between the first set of electrodes and the first piezoelectric layer; and
    a second adhesion layer disposed between the at least one second electrode and the second piezoelectric layer.

19. The touch panel of claim 1, further comprising at least one of:
    a first protective layer disposed over the first set of electrodes; and
    a second protective layer disposed over the at least one second electrode.

20. A method, comprising:
    fabricating a touch sensor, comprising:
        coextruding a core layer with at least one piezoelectric layer, the piezoelectric layer disposed on a first surface of the core layer;
        poling the at least one piezoelectric layer by applying an electric field across the at least one piezoelectric polymer layer;
        forming a first set of electrodes over the piezoelectric layer;
        forming at least one second electrode over a second surface of the core layer; and
    coupling the first set of electrodes and the second set of electrodes to circuitry configured to detect a change in an electrical signal of at least one electrode of the first set of electrodes referenced to the second electrode in response to a touch applied to the touch sensor.

* * * * *